(12) United States Patent
Fan

(10) Patent No.: US 8,622,491 B2
(45) Date of Patent: Jan. 7, 2014

(54) CONTAINER DATA CENTER

(75) Inventor: Xiao-Yu Fan, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 129 days.

(21) Appl. No.: 13/226,040

(22) Filed: Sep. 6, 2011

(65) Prior Publication Data

US 2012/0313495 A1 Dec. 13, 2012

(30) Foreign Application Priority Data

Jun. 8, 2011 (CN) .......................... 2011 1 0152262

(51) Int. Cl.
*A47B 95/02* (2006.01)
*A47B 67/02* (2006.01)
*A47F 5/08* (2006.01)

(52) U.S. Cl.
USPC ........................................ 312/319.5; 312/248

(58) Field of Classification Search
USPC ................ 312/327, 328, 319.1, 319.2, 319.3, 312/319.4, 319.5, 319.6, 319.7, 319.8, 248, 312/228, 223.1
See application file for complete search history.

(56) References Cited

U.S. PATENT DOCUMENTS

| | | | | |
|---|---|---|---|---|
| 3,787,725 A * | 1/1974 | Lafontaine | .................... | 318/491 |
| 4,489,810 A * | 12/1984 | Curtis | ........................ | 312/272.5 |
| 4,729,490 A * | 3/1988 | Ziegenbein | ................... | 220/211 |
| 4,736,929 A * | 4/1988 | McMorris | ...................... | 254/344 |
| 4,918,660 A * | 4/1990 | Perrot | ............................ | 366/185 |
| 4,924,626 A * | 5/1990 | Ts'ao | ............................... | 49/347 |
| 5,273,352 A * | 12/1993 | Saper | ............................. | 312/7.2 |
| 5,367,598 A * | 11/1994 | Devenish et al. | ............. | 385/135 |
| 5,522,582 A * | 6/1996 | Dilks | ............................ | 254/323 |
| 5,671,859 A * | 9/1997 | Sheu et al. | .................... | 220/263 |
| 5,765,698 A * | 6/1998 | Bullivant | ........................ | 211/26 |
| 6,354,682 B1 * | 3/2002 | Nott et al. | ..................... | 312/248 |
| 6,550,878 B2 * | 4/2003 | Nott et al. | ..................... | 312/248 |
| 6,819,551 B2 * | 11/2004 | Chen | ......................... | 361/679.02 |
| 7,025,298 B2 * | 4/2006 | Priest et al. | ................. | 242/388.8 |
| 7,419,204 B2 * | 9/2008 | Coble et al. | .................. | 296/57.1 |
| 7,556,126 B2 * | 7/2009 | Wang | ............................ | 187/314 |
| 7,600,345 B2 * | 10/2009 | Slopack | .......................... | 49/358 |
| 8,006,958 B2 * | 8/2011 | Starks et al. | .................. | 254/323 |
| 8,056,992 B2 * | 11/2011 | Gassner | ...................... | 312/319.7 |
| 8,083,300 B2 * | 12/2011 | MaCall | ......................... | 312/245 |
| 8,091,969 B2 * | 1/2012 | Caveney et al. | .............. | 312/248 |
| 2009/0230827 A1 * | 9/2009 | MaCall | ........................ | 312/223.1 |

\* cited by examiner

*Primary Examiner* — Darnell Jayne
*Assistant Examiner* — Kimberley S Wright
(74) *Attorney, Agent, or Firm* — Altis Law Group, Inc.

(57) ABSTRACT

A container data center includes a housing, a driving device, a gear device, and a rope. The hosing includes a sidewall, and the gear device and the driving device are received within the housing. The gear device includes a winding member, one end of the rope is connected to the winding member, and the other end is connected to the rotatable sidewall. The winding member is mechanically connected to the driving device, the driving device drives the winding member to wind or unwind the rope, and the sidewall is closed or opened according to the rotation direction of the winding member.

7 Claims, 4 Drawing Sheets

CONTAINER DATA CENTER

BACKGROUND

1. Technical Field

The disclosure generally relates to data centers, and particularly to a container data center.

2. Description of the Related Art

Container data centers (CDCs) usually include servers, network equipments, storage devices, power supplies, and other electronic components. These electronic components are arranged or received within a metal container. However, when different CDCs need to be electrically connected to each other for communication, the connections are complicated and the debugging is inconvenient.

Therefore, there is room for improvement within the art.

BRIEF DESCRIPTION OF THE DRAWINGS

Many aspects of a container data center can be better understood with reference to the following drawings. The components in the drawings are not necessarily drawn to scale, the emphasis instead being placed upon clearly illustrating the principles of the container data center. Moreover, in the drawings, like reference numerals designate corresponding parts throughout the several views. Wherever possible, the same reference numbers are used throughout the drawings to refer to the same or like elements of an embodiment.

DETAILED DESCRIPTION

Figure 1:
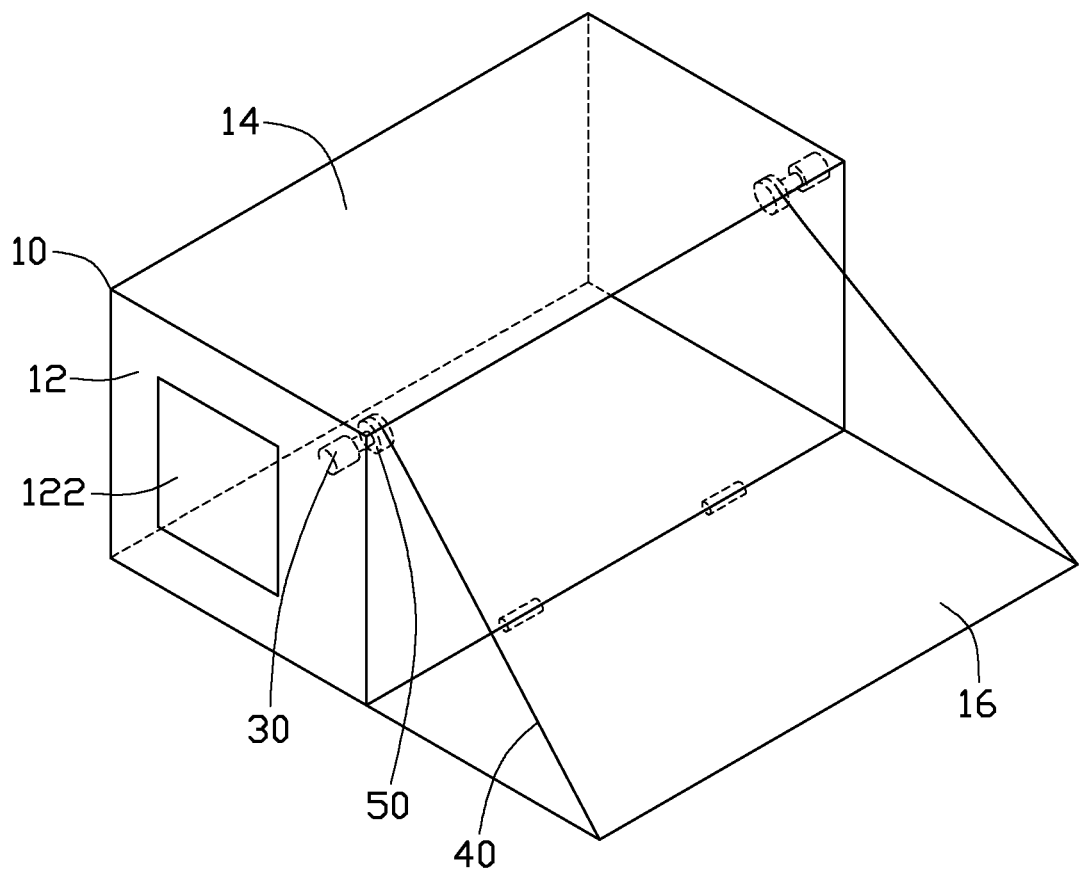
FIG. 1 is a schematic view of a container data center including a housing, two driving devices, and two gear devices, according to an embodiment of the disclosure.

FIG. 1 is schematic view of a container data center (CDC) 100 including a housing 10, two driving devices 30, and two gear devices 50, according to an embodiment of the disclosure. The driving devices 30 and the gear devices 50 are received in the housing 10. The CDC 100 further includes two ropes 40 connected to the gear devices 50 and the housing 10. In this embodiment, the ropes 40 may include any other similar structure, such as thread, wire, cable, chain, etc.

Figure 4:
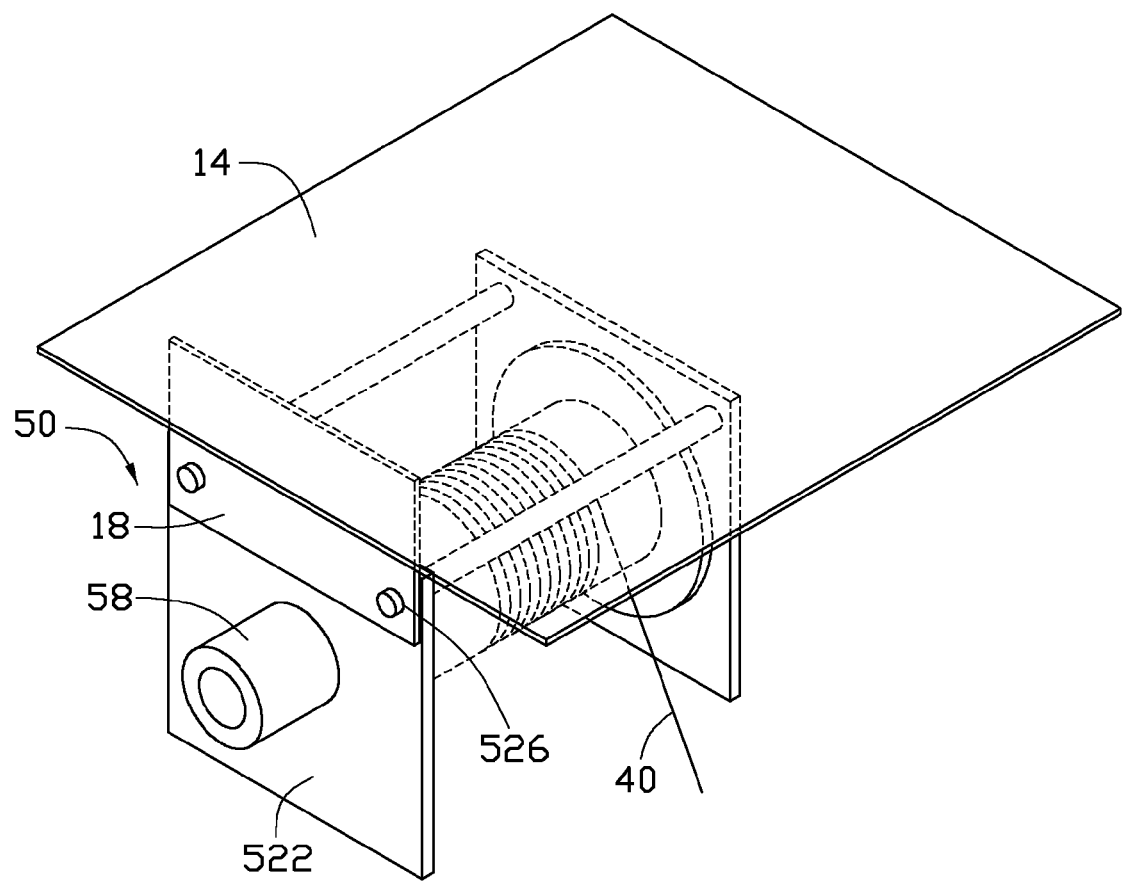
FIG. 4 is a schematic view of the gear device fixed on the housing shown in FIG. 1 of the disclosure.

Referring to FIG. 4, in this embodiment, the housing 10 can be a container, and include two end walls 12, a top wall 14, a bottom wall 15, two sidewalls 16, and two support plates 18. The end walls 12, the top wall 14, the bottom wall 15 and the sidewalls 16 form a substantially rectangular receiving space, to secure and receive servers, storage devices, power supplies, network equipments, and other electronic components, which are in electronic communication with data centers.

The two end walls 12 are positioned substantially parallel and opposite to each other. Each end wall 12 includes a load-bearing member (not shown) to hold and fix an electronic equipment such as the driving device 30. One of the end walls 12 defines an opening 122; therefore, the connection lines between different CDCs 100 can pass through the opening 122. Moreover, some electronic components can be moved and can be received in the housing 10 through the opening 122.

The top wall 14 is substantially parallel with the bottom wall 15, and the end walls 12 are connected between the top wall 14 and the bottom wall 15. The two sidewalls 16 are connected substantially parallel between the top wall 14 and the bottom wall 15. One edge of one sidewall 16 is rotatably connected to the bottom wall 15 by means of hinges, for example, and the other edge is connected to the ropes 40. Thus, the driving devices 50 can wind or unwind the ropes 40, making the sidewall 16 rotatable to close or open relative to the bottom wall 15. The support plates 18 are fixed on the top wall 14, and perpendicularly extend towards the bottom wall 15.

Figure 2:
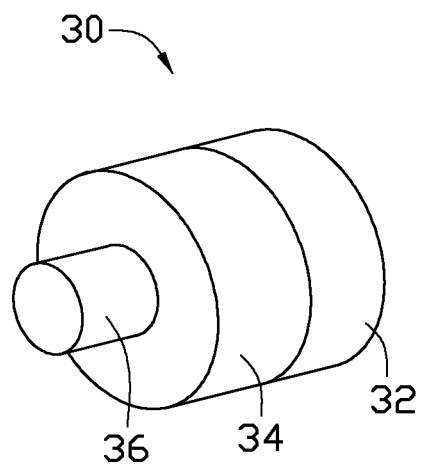
FIG. 2 is an enlarged view of one driving device shown in FIG. 1.

Further referring to FIG. 2, in this embodiment, the driving devices 30 are fixed on the load-bearing members of the end wall 12 by means of riveting, for example. Each driving device 30 includes an electric motor 32, a transmission element 34, and a rotating shaft 36. The electric motor 32 can generate force to rotate the rotating shaft 36 to wind the rope 40, to further close the sidewall 16. The transmission element 34 is mechanically connected between the electric motor 32 and the rotating shaft 36 to provide speed, and torque conversions, and transmit power from the electric motor 32 to the rotating shaft 36, thereby activating, and rotating the rotating shaft 36.

Figure 3:
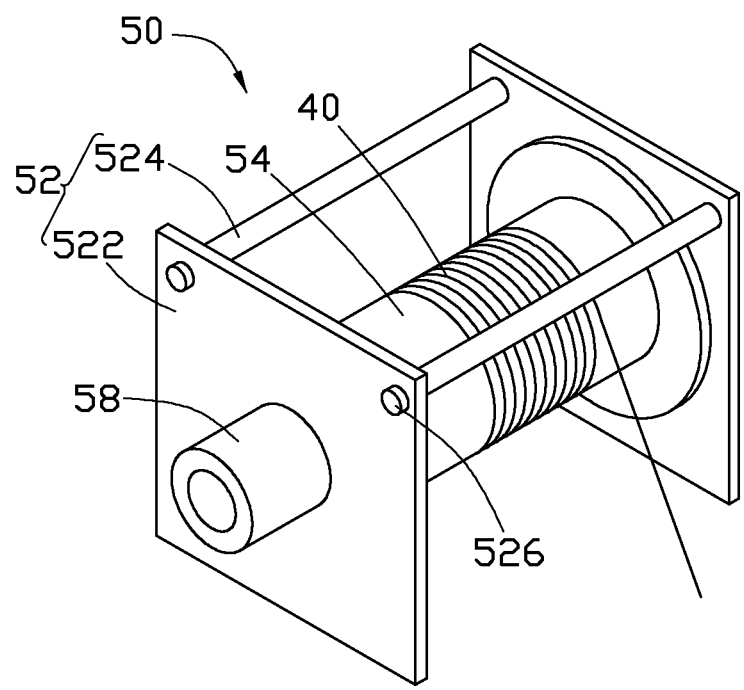
FIG. 3 is an enlarged view of one gear device shown in FIG. 1.

Referring to FIGS. 3 and 4, each gear device 50 includes a fixing frame 52, a winding member 54, and a connection member 58. In this embodiment, the winding member 54 is a pulley, but in other embodiments, other structures, such as winding gears, may be used. In this embodiment, the fixing frame 52 includes two connection plates 522 and two connection posts 524. Each connection plate 522 is a substantially rectangular plate, and each connection post 524 includes a fixing section 526. The fixing section 526 can be a bolt; thereby, the connection posts 524 are mechanically connected between the two connection plates 522, to assemble the connection plates 522, the connection posts 524 and the winding member 54 together. Each connection plate 522 is fixed on the corresponding support plate 18 through the fixing section 526 by means of threaded connection, so the gear devices 50 are fixed on the top wall 14 through the support plates 18.

In this embodiment, the winding member 54 usually comprising of a wheel with a grooved rim are mechanically rotatably connected to the connection plates 522. The rope 40 is wound or unwound around the winding member 54, so the winding member 54 can wind or unwind the rope 40 to open or close the hinged sidewall 16. The connection member 58 is a substantially hollow cylinder and is rotatably positioned to one of the connection plates 522. One end of the winding member 54 is mechanically connected and fixed to one end of the connection member 58, and the rotating shaft 36 is mechanically connected and fixed within the other end of the connection member 58. Thus, when the driving devices 30 are activated, rotating shafts 36 rotate the winding members 54 through the connection members 58.

In use, the electric motors 32 are activated and rotate the rotating shafts 36, so the rotating shafts 36 drive the corresponding winding members 54 to turn in different directions to wind or unwind the ropes 40. When the winding members 54 rotate in a direction, such as clockwise, to unwind the ropes 40, the sidewall 16 rotates relative to the bottom wall 15 and can be opened to different angles. When the winding members 54 rotate in an opposite direction, such as counterclockwise, to wind the ropes 40, the ropes 40 are wound or unwound around the winding members 54, and the sidewall 16 rotates relative to the bottom wall 15 and is closed.

In addition, the driving devices 30 can be fixed on the corresponding support plates 18 of the top wall 14, and the gear devices 50 can be fixed on the end wall 12.

In summary, in the CDC 100 of this disclosure, the electric motors 32 rotate the winding members 54 to wind or unwind the ropes 40, so that the sidewall 16 is automatically closed or opened relative to the bottom wall 15 accordingly. This is suitable for debugging, installing, and connections of different CDCs 100 and can avoid frequent manual operations.

In the present specification and claims the word "a" or "an" preceding an element does not exclude the presence of a plurality of such elements. Further, the word "comprising" does not exclude the presence of other elements or steps than those listed.

It is to be understood, however, that even though numerous characteristics and advantages of the exemplary disclosure have been set forth in the foregoing description, together with details of the structure and function of the exemplary disclosure, the disclosure is illustrative only, and changes may be made in detail, especially in matters of shape, size, and arrangement of parts within the principles of exemplary disclosure to the full extent indicated by the broad general meaning of the terms in which the appended claims are expressed.

What is claimed is:

1. A container data center, comprising:
    a housing comprising a sidewall;
    the housing is capable of securing and receiving servers, memories, network equipment and power supplies, and further comprises two end walls positioned in parallel and opposite to each other, one of the end walls defines an opening, and connection lines between different container data centers are allowed to pass through the opening;
    a driving device fixed within the housing, the driving device comprising an electric motor and a rotating shaft connected to the electric motor;
    a gear device fixed within the housing, and comprising a winding member;
    a rope connected to the sidewall and the winding member;
    wherein the housing further comprises a top wall and a bottom wall parallel to the top wall, the end walls and the sidewall are connected between the top wall and the bottom wall, and one edge of the sidewall is rotatably connected to the bottom wall, the other edge is connected to the rope;
    wherein the gear device further comprises a connection member, the connection member is a hollow cylinder, one end of the winding member is mechanically connected and fixed to a first end of the connection member, and the rotating shaft is mechanically connected and fixed within a second end of the connection member; and
    wherein the driving device drives the winding member to wind or unwind the rope, and the sidewall is closed or opened according to the rotation direction of the winding member; and
    wherein the electric motor generates force to rotate the rotating shaft to wind the rope to close the sidewall, the driving device further comprises a transmission element mechanically connected between the electric motor and the rotating shaft, the transmission element provides speed and torque conversions and transmit power from the electric motor to the rotating shaft to rotate the rotating shaft, the gear device further comprise a fixing frame, the fixing frame comprises two connection plates and two connection posts, each connection post includes a fixing section, the connection posts are mechanically and transversely connected between the two connection plates to assemble the connection plates, the connection posts and the winding member together wherein the housing further comprises two support plates fixed on the top wall, the support plates extend towards the bottom wall, each connection plate is fixed on a corresponding support plate through the fixing section, and the gear devices are fixed on the top wall through the support plates.

2. The container data center as claimed in claim 1, wherein the winding member comprising of a wheel with a grooved rim are mechanically rotatably connected to the connection plates, the rope is fixed and is wound or unwound around the winding member, the winding member winds or unwinds the rope to open or close the sidewall.

3. The container data center as claimed in claim 2, wherein the connection member is rotatably positioned to one of the connection plate, and the rotating shaft rotates the winding member through the connection member.

4. A container data center, comprising:
    a housing comprising a sidewall and a bottom wall connected to the sidewall;
    the housing is capable of securing and receiving servers, memories, network equipment and power supplies, and further comprises two end walls positioned in parallel and opposite to each other, one of the end walls defines an opening, and connection lines between different container data centers are allowed to pass through the opening;
    a driving device fixed within the housing, the driving device comprising:
    an electric motor for providing power;
    a rotating shaft for receiving the power from the electric motor and rotating according to the power;
    a gear device fixed within the housing, and comprising:
    a winding member; and
    a connection member being a hollow cylinder, one end of the winding member mechanically connected and fixed to a first end of the connection member, and the rotating shaft mechanically connected and fixed within a second end of the connection member; and
    a rope connected to the sidewall and the winding member, wherein the housing further comprises a top wall parallel to the bottom wall, the end walls and the sidewall are connected between the top wall and the bottom wall, and one edge of the sidewall is rotatably connected to the bottom wall, the other edge is connected to the rope; wherein the electric motor powers the rotating shaft to rotate the winding member in different directions, when the winding member rotates to wind the rope, the sidewall rotates relative to the bottom wall and is closed; when the winding member rotates to unwind the rope, the sidewall rotates relative to the bottom wall and is opened to different angles;
    wherein the gear device further comprise a fixing frame, the fixing frame comprises two connection plates and two connection posts, each connection post includes a fixing section, the connection posts are mechanically and transversely connected between the two connection plates to assemble the connection plates, the connection posts and the winding member together wherein the housing further comprises two support plates fixed on the top wall, the support plates extend towards the bottom wall, each connection plate is fixed on a corresponding support plate through the fixing section, and the gear devices are fixed on the top wall through the support plates.

5. The container data center as claimed in claim 4, wherein the driving device further comprises a transmission element mechanically connected between the electric motor and the rotating shaft, the transmission element provides speed and torque conversions and transmit power from the electric motor to the rotating shaft to rotate the rotating shaft.

6. The container data center as claimed in claim 4, wherein the winding member comprising of a wheel with a grooved rim are mechanically rotatably connected to the connection plates, the rope is fixed and is wound or unwound around the winding member, the winding member winds or unwinds the rope to open or close the sidewall.

7. The container data center as claimed in claim 6, wherein the connection member is rotatably positioned to one of the connection plate, and the rotating shaft rotates the winding member through the connection member.

* * * * *